US012660277B2

(12) United States Patent
Tokuyama et al.

(10) Patent No.: US 12,660,277 B2
(45) Date of Patent: Jun. 16, 2026

(54) SEMICONDUCTOR DEVICE HAVING A STRUCTURE IN WHICH A FIELD PLATE ELECTRODE AND A GATE ELECTRODE ARE BURIED IN DIFFERENT TRENCHES

(71) Applicants: Kabushiki Kaisha Toshiba, Tokyo (JP); Toshiba Electronic Devices & Storage Corporation, Tokyo (JP)

(72) Inventors: Shuhei Tokuyama, Nonoichi Ishikawa (JP); Tsuyoshi Kachi, Kanazawa Ishikawa (JP); Toshifumi Nishiguchi, Hakusan Ishikawa (JP); Hiroaki Katou, Nonoichi Ishikawa (JP)

(73) Assignees: Kabushiki Kaisha Toshiba, Kawasaki (JP); Toshiba Electronic Devices & Storage Corporation, Kawasaki (JP)

( * ) Notice: Subject to any disclaimer, the term of this patent is extended or adjusted under 35 U.S.C. 154(b) by 674 days.

(21) Appl. No.: 18/168,243

(22) Filed: Feb. 13, 2023

(65) Prior Publication Data

US 2024/0096972 A1    Mar. 21, 2024

(30) Foreign Application Priority Data

Sep. 20, 2022    (JP) ................................. 2022-149553

(51) Int. Cl.
H10D 64/00          (2025.01)
H10D 30/66          (2025.01)
(52) U.S. Cl.
CPC ......... H10D 64/112 (2025.01); H10D 30/668 (2025.01); H10D 64/117 (2025.01)
(58) Field of Classification Search
CPC .. H10D 64/112; H10D 30/668; H10D 64/117; H10D 62/127; H10D 62/393; H10D 64/519

(Continued)

(56) References Cited

U.S. PATENT DOCUMENTS 9,978,859 B2    5/2018    Park et al.
10,763,352 B2    9/2020    Matsuba et al.
(Continued)

FOREIGN PATENT DOCUMENTS

JP          2019-145633 A          8/2019
JP          2020-047742 A          3/2020
(Continued)

OTHER PUBLICATIONS

Chanho Park, et al., "A New 200 V Dual Trench MOSFET With Stepped Oxide for Ultra Low RDS(on)," Proceedings of the 31st International Symposium on Power Semiconductor Devices & ICs, May 19-23, 2019, Shanghai, China, pp. 95-98, https://doi.org/10.1109/ISPSD.2019.8757572.

(Continued)

*Primary Examiner* — Mohammad M Hoque
(74) *Attorney, Agent, or Firm* — Kim & Stewart LLP

(57)          ABSTRACT

A semiconductor device according to the present embodiment includes: a first electrode; a first semiconductor region of a first conductivity type disposed above the first electrode; a second semiconductor region of a second conductivity type disposed on the first semiconductor region; a third semiconductor region of the first conductivity type disposed on the second semiconductor region; a second electrode disposed in the first semiconductor region; a third electrode facing the second semiconductor region via a second insulating film; a fourth electrode having a portion adjacent to a part of the second semiconductor region and the third semiconductor region in the second direction, the second semiconductor region, and the third semiconductor region; and a fifth electrode disposed in the first insulating film, having a bottom located closer to the first electrode than a bottom of the portion, having a top located on an upper surface of the first insulating film.

18 Claims, 10 Drawing Sheets

(58) Field of Classification Search
USPC ........................................................ 257/330
See application file for complete search history.

(56)                          References Cited

U.S. PATENT DOCUMENTS

| | | | |
|---|---|---|---|
| 11,101,383 | B2 | 8/2021 | Nishiwaki |
| 11,127,854 | B2 | 9/2021 | Katou et al. |
| 11,177,381 | B2 | 11/2021 | Katou et al. |
| 11,489,070 | B2 | 11/2022 | Kikuchi et al. |
| 2014/0077278 | A1* | 3/2014 | Nozu ................. H10D 30/0297 |
| | | | 257/773 |
| 2017/0271498 | A1 | 9/2017 | Park et al. |
| 2020/0295150 | A1 | 9/2020 | Nishiwaki et al. |
| 2022/0077293 | A1 | 3/2022 | Shimomura et al. |
| 2024/0055474 | A1* | 2/2024 | Saito .................... H10D 64/519 |
| 2025/0015151 | A1* | 1/2025 | Nagata ................. H10D 62/127 |

FOREIGN PATENT DOCUMENTS

| | | | |
|---|---|---|---|
| JP | 2020-150185 | A | 9/2020 |
| JP | 2021-040105 | A | 3/2021 |
| JP | 2021-044470 | A | 3/2021 |
| JP | 2021145046 | A | 9/2021 |

OTHER PUBLICATIONS

Notice of Reasons for Refusal (Office Action) mailed Aug. 22, 2025 in corresponding Japanese Patent Application No. 2022-149553, with English machine translation, 5 pages.

* cited by examiner

-○- FIRST EMBODIMENT $(V_{DSS})$

-△- FIRST EMBODIMENT $(V_{DSX})$

-●- COMPARATIVE EXAMPLE 1 $(V_{DSS})$

-■- COMPARATIVE EXAMPLE 1 $(V_{DSX})$

-▲- COMPARATIVE EXAMPLE 2 $(V_{DSS})$

-◆- COMPARATIVE EXAMPLE 2 $(V_{DSX})$

WITHSTAND VOLTAGE(V)

IMPURITY CONCENTRATION (cm$^{-3}$)

SEMICONDUCTOR DEVICE HAVING A STRUCTURE IN WHICH A FIELD PLATE ELECTRODE AND A GATE ELECTRODE ARE BURIED IN DIFFERENT TRENCHES

CROSS-REFERENCE TO RELATED APPLICATIONS

This application is based upon and claims the benefit of priority from the prior Japanese Patent Application No. 2022-149553, filed on Sep. 20, 2022; the entire contents of which are incorporated herein by reference.

FIELD

Embodiments described herein relate generally to a semiconductor device.

BACKGROUND

A power metal oxide semiconductor field effect transistor (MOSFET) having a structure in which a field plate electrode (FP electrode) and a gate electrode are buried in different trenches (gate-separated trench-FP structure) is known. In the power MOSFET having the gate-separated trench-FP structure, the dimension of the gate electrode is easily controlled as compared with that in the power MOSFET having a structure in which the field plate electrode and the gate electrode are buried in the same trench (trench FP structure), and therefore a gate capacitance can be reduced.

However, in the gate-separated trench-FP structure, since it is necessary to form a gate electrode protruding to a drift region formed below a base region, electric field concentration occurs in the drift region near a lower end of the gate electrode. Therefore, even if an on-resistance is tried to be decreased, the impurity concentration in the drift region cannot be increased to a value of an impurity concentration in the trench FP structure in order to maintain a withstand voltage.

DETAILED DESCRIPTION

Figure 1:
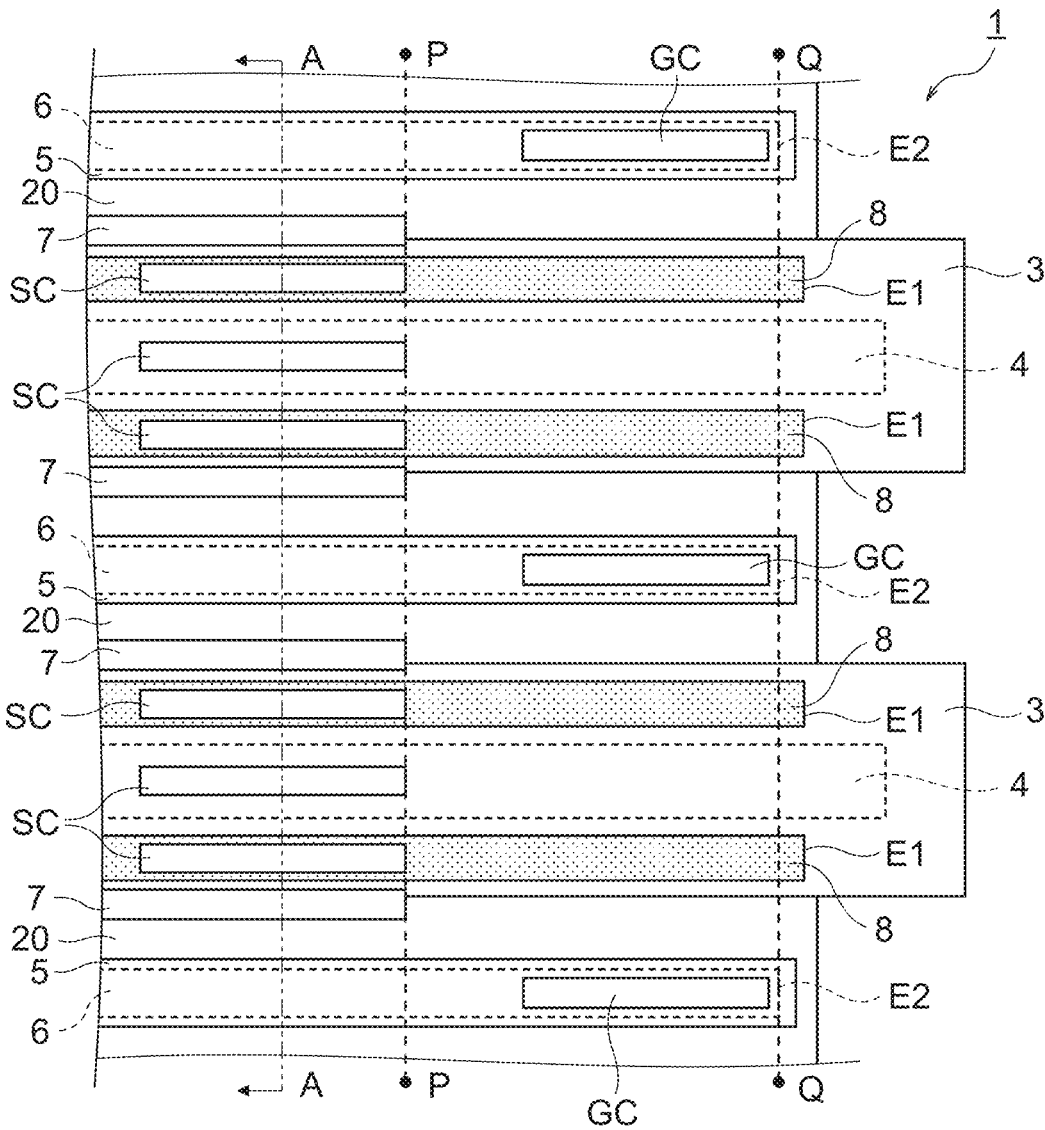
FIG. 1 is a plan view of a semiconductor device according to a first embodiment.
Figure 1:
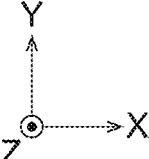

A semiconductor device according to the present embodiment includes: a first electrode; a first semiconductor region of a first conductivity type disposed above the first electrode and electrically connected to the first electrode; a second semiconductor region of a second conductivity type disposed on the first semiconductor region; a third semiconductor region of the first conductivity type disposed on the second semiconductor region; a second electrode disposed in the first semiconductor region via a first insulating film; a third electrode facing the second semiconductor region via a second insulating film in a second direction perpendicular to a first direction directed from the second semiconductor region toward the third semiconductor region; a fourth electrode having a portion adjacent to a part of the second semiconductor region and the third semiconductor region in the second direction, and electrically connected to the second electrode, the second semiconductor region, and the third semiconductor region; and a fifth electrode disposed in the first insulating film, having a bottom located closer to the first electrode than a bottom of the portion, having a top located on an upper surface of the first insulating film, and electrically connected to the fourth electrode.

Embodiments will now be explained with reference to the accompanying drawings. The embodiments do not limit the present invention. The drawings are schematic or conceptual, and a ratio between portions and the like are not necessarily the same as actual ones. In the specification and the drawings, elements similar to those described above regarding the previously described drawings are denoted by the same reference numerals, and detailed description thereof is appropriately omitted.

For convenience of description, an XYZ orthogonal coordinate system is adopted as illustrated in FIGS. 1 to 4 and the like. The Z-axis direction is a stacking direction (thickness direction) in the semiconductor device. In the X-axis direction, a side on which a termination structure is present is also referred to as "right", and a side opposite thereto is also referred to as "left". In the Z direction, a source electrode 11 side is also referred to as "upper", and a drain electrode side is also referred to as "lower". Note that this expression is for convenience and independent of the direction of gravity.

In the following description, notations of $n^+$, n, $n^-$, $p^+$, p, $p^-$, and the like may be used to represent a relative level of impurity concentration in each conductivity type. That is, $n^+$ indicates that an n-type impurity concentration is relatively higher than n, and $n^-$ indicates that the n-type impurity concentration is relatively lower than n. In addition, $p^+$ indicates that a p-type impurity concentration is relatively higher than p, and $p^-$ indicates that the p-type impurity concentration is relatively lower than p. The n-type, $n^+$-type, and $n^-$-type are examples of the first conductivity type in the claims. The p-type, $p^+$-type, and $p^-$-type are examples of the second conductivity type in the claims. Note that, in the configuration of the semiconductor device described below, the n-type and the p-type may be inverted. That is, the first conductivity type may be p-type.

A semiconductor device 1 according to a first embodiment will be described with reference to FIGS. 1 to 4. In the present embodiment, the semiconductor device 1 is a vertical MOSFET.

First Embodiment

Figure 2:
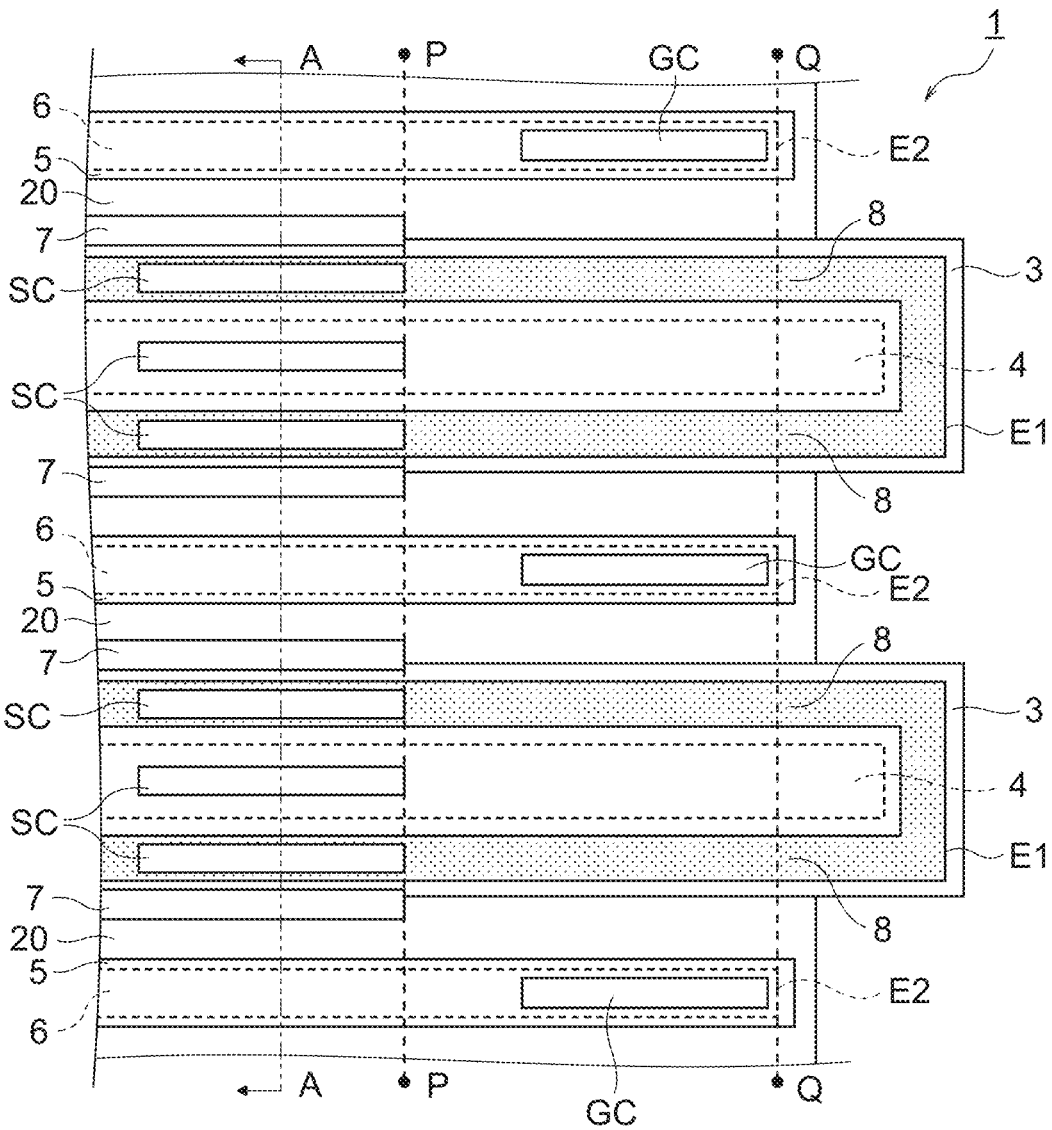
FIG. 2 is a plan view illustrating another configuration example of the semiconductor device according to the first embodiment.
Figure 2:
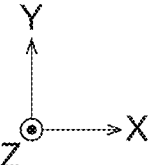

FIGS. 1 and 2 are plan views of the semiconductor device 1 according to the first embodiment. FIG. 2 is a plan view illustrating another configuration example of the semiconductor device 1 of FIG. 1. FIGS. 1 and 2 are different from each other only in a structure of a portion outside line Q-Q in the X-axis direction (termination structure), and there is no difference in a structure of a portion inside line Q-Q. Hereinafter, when the termination structure is not mentioned, the present embodiment will be described with reference to the configuration of FIG. 1.

Figure 3:
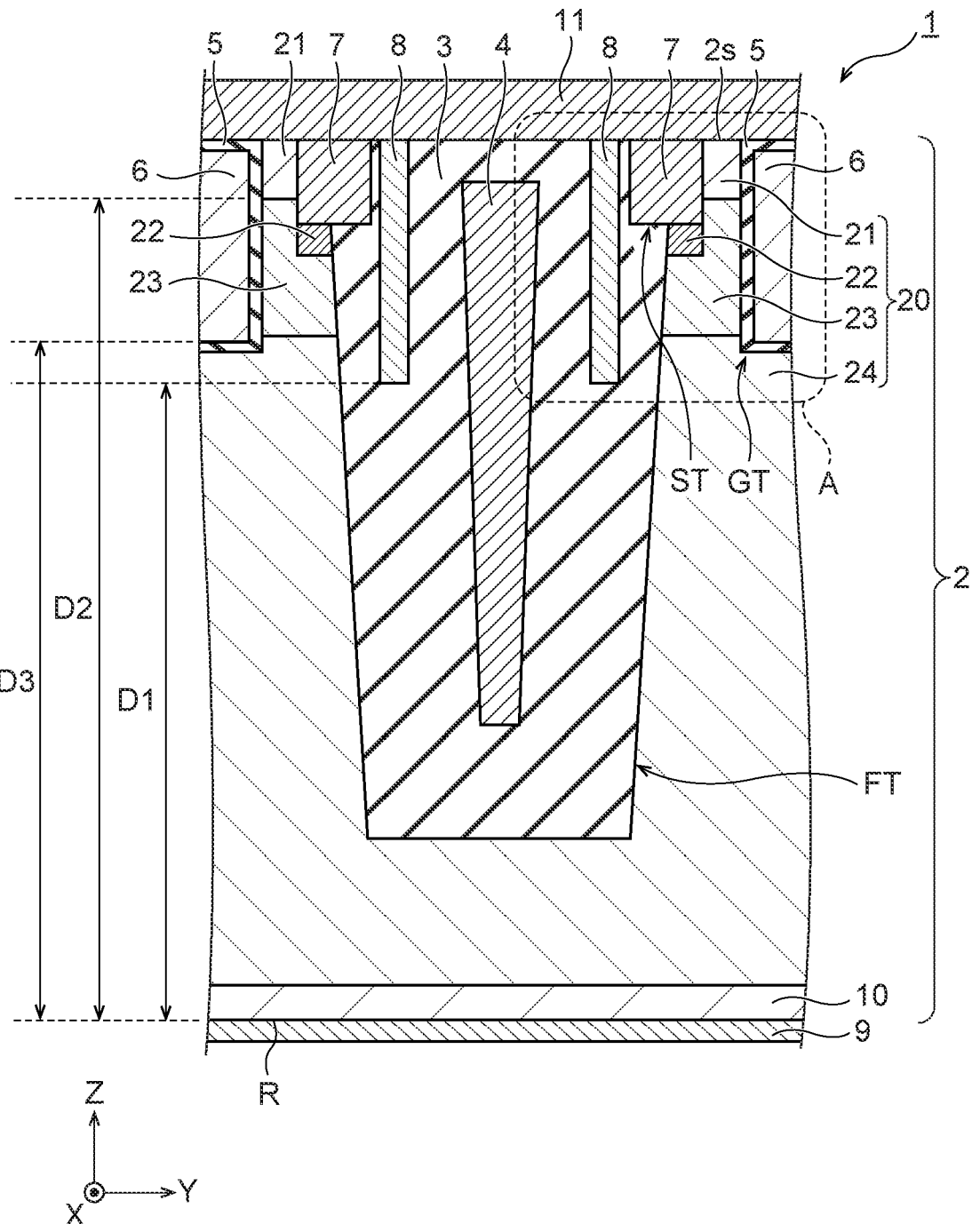
FIG. 3 is a cross-sectional view of the semiconductor device according to the first embodiment, taken along line A-A in FIG. 1.
Figure 4:
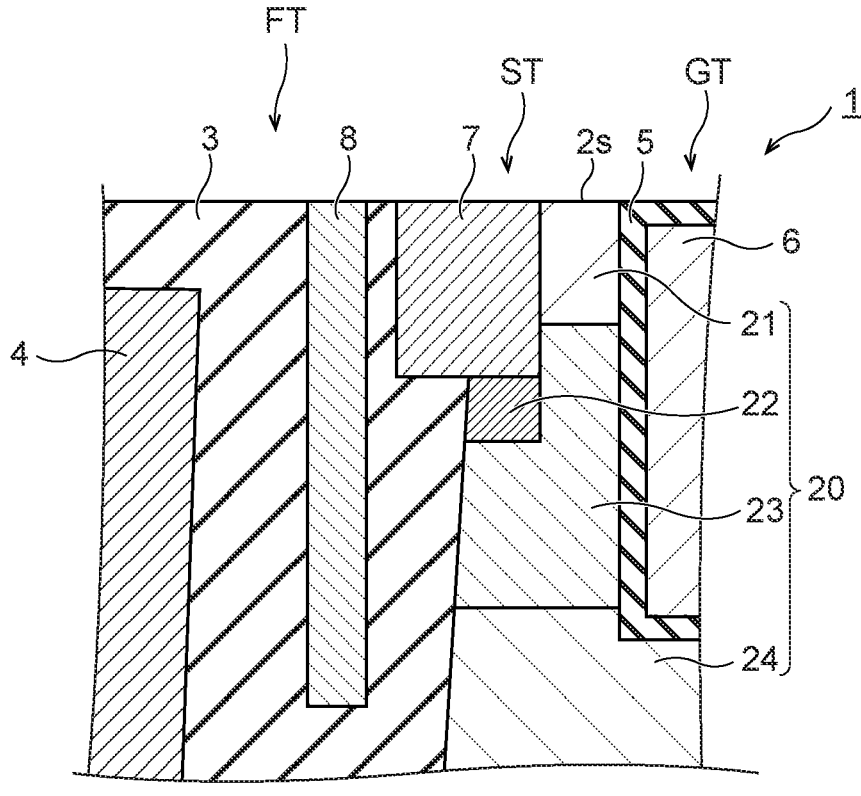
FIG. 4 is an enlarged view of a region A in FIG. 3.
Figure 4:
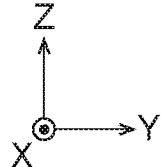

FIG. 3 is a cross-sectional view taken along line A-A in FIG. 1. FIG. 4 is an enlarged view of a region A surrounded by a dotted line illustrated in FIG. 3. Note that the cross-sectional view of the configuration example of FIG. 2 is the same as FIGS. 3 and 4.

As illustrated in FIG. 3, the semiconductor device 1 includes a semiconductor region 2, a field plate insulating film (FP insulating film) 3, a field plate electrode (FP electrode) 4, a gate insulating film 5, a gate electrode 6, a source electrode (source metal) 11, a portion (source contact) 7 of the source electrode 11, a buried electrode 8, and a drain electrode 9. The semiconductor region 2 includes a semiconductor portion 20 and a drain region 10. Note that, in order to avoid complexity, the source electrode 11 is not illustrated in the drawing of FIG. 4 and subsequent drawings.

Hereinafter, details of each element will be described with reference to FIGS. 3 and 4.

The semiconductor region 2 may be an epitaxial layer or a semiconductor substrate. The semiconductor region 2 is, for example, made of silicon (Si), but may be made of a compound semiconductor such as SiC or GaN. When silicon (Si) is used as a semiconductor material, for example, arsenic (As), phosphorus (P), or antimony (Sb) can be used as an n-type impurity. When silicon (Si) is used as the semiconductor material, for example, boron (B) can be used as a p-type impurity. Hereinafter, for convenience of description, a surface of the semiconductor region 2 is substantially planar, and an upper surface is referred to as a main surface $2s$. Note that this does not limit the shape of the semiconductor region 2.

The semiconductor portion 20 includes a source region 21, a contact region 22, a base region 23, and a drift region 24.

The source region 21 is a semiconductor region that functions as a source of the MOSFET. As illustrated in FIGS. 3 and 4, the source region 21 is disposed on the base region 23. The source region 21 is disposed in a region between the gate insulating film 5 and the source contact 7. The source region 21 is, for example, an n$^+$-type semiconductor region. The source region 21 is an example of the third semiconductor region in the claims.

The contact region 22 is disposed in order to suppress element breakdown due to a parasitic transistor by preventing generation of a potential difference between the base region 23 and the source contact 7 when a reverse voltage is applied to the MOSFET. As illustrated in FIGS. 3 and 4, the contact region 22 is disposed in a region between the base region 23 and the source contact 7. The contact region 22 is, for example, a p$^+$-type semiconductor region.

The base region 23 is a semiconductor region that functions as a base of the MOSFET. The base region 23 is disposed on the drift region 24. The base region 23 is disposed between the drift region 24 and the source contact 7. When a voltage is applied to the gate electrode 6, the base region 23 forms a channel and allows carriers to flow between the drain region 10 and the source region 21. The base region 23 is, for example, a p$^-$-type semiconductor region. The base region 23 is an example of the second semiconductor region in the claims.

The drift region 24 is a semiconductor region that functions as a drift region of the MOSFET. The drift region 24 is disposed on the drain region 10. The drift region 24 is disposed between the drain region 10 and the source contact 7. The drift region 24 is, for example, an n$^-$-type semiconductor region. The drift region 24 is an example of the first semiconductor region in the claims.

The FP insulating film 3 electrically insulates the FP electrode 4 from the semiconductor portion 20. The FP insulating film 3 fills a field plate trench (FP trench) FT formed on the main surface $2s$ of the semiconductor region 2. The FP trench FT is a trench formed so as to reach the drift region 24 from the main surface $2s$. Note that, for convenience of description, the FP trench FT is formed on the main surface $2s$ of the semiconductor region 2, but this does not limit the shape of the semiconductor region 2.

The FP insulating film 3 is made of an insulating material such as silicon oxide or silicon nitride. The FP insulating film 3 is an example of the first insulating film in the claims.

The FP electrode 4 is disposed in the drift region 24 via the FP insulating film 3. The FP electrode 4 is disposed in order to alleviate concentration of a reverse electric field between the gate electrode 6 and the drain electrode 9 to increase a withstand voltage. The FP electrode 4 is made of, for example, polysilicon. In the present embodiment, as illustrated in FIG. 1, the FP electrode 4 includes a source contact SC. The source contact SC is a portion extending upward from a part of the FP electrode 4, and is connected to the source electrode 11. The FP electrode 4 is electrically connected to the portion (source contact) 7 via the source electrode 11. The FP electrode 4 is an example of the second electrode in the claims.

The gate insulating film 5 electrically insulates the gate electrode 6 from the semiconductor portion 20. The gate insulating film 5 fills a gate trench GT formed on the main surface $2s$ of the semiconductor region 2. The gate trench GT is a trench formed so as to reach the drift region 24 from the main surface $2s$, and is formed to be shallower than the FP trench FT. Note that, for convenience of description, the gate trench GT is formed on the main surface $2s$ of the semiconductor region 2, but this does not limit the shape of the semiconductor region 2.

The gate insulating film 5 is made of an insulating material such as silicon oxide or silicon nitride. The gate insulating film 5 is formed using, for example, a thermal oxidation method. The gate insulating film 5 is an example of the second insulating film in the claims.

The gate electrode 6 is an electrode that functions as a gate electrode of the MOSFET. The gate electrode 6 is disposed in the gate insulating film 5. The gate electrode 6 is disposed so as to face the FP insulating film 3 via a part of the drift region 24, the base region 23, the source region 21, and the gate insulating film 5 in the Y-axis direction. The gate electrode 6 is made of, for example, polysilicon. In the present embodiment, as illustrated in FIG. 1, the gate electrode 6 includes a gate contact GC. The gate contact GC extends upward from a part of the gate electrode 6 and is connected to a gate metal (not illustrated). The gate electrode 6 is an example of the third electrode in the claims.

As illustrated in FIGS. 3 and 4, a lower end (corner) of the gate electrode 6 is located near a boundary between the base region 23 and the drift region 24. Since the base region 23 is a p⁻-type region and the drift region 24 is an n⁻-type region, the lower end of the gate electrode 6 is located near pn junction. Therefore, an electric field is more likely to concentrate near the pn junction.

The source electrode 11 is an electrode that functions as a source electrode of the MOSFET. As illustrated in FIGS. 3 and 4, the source electrode 11 has the portion (source contact) 7 adjacent to a part of the base region 23 and the source region 21 in the Y-axis direction. The source electrode 11 is electrically connected to the FP electrode 4, the base region 23, and the source region 21. In the present embodiment, for example, the source contact 7 is disposed in a source trench ST formed so as to straddle a boundary between the FP insulating film 3 and the semiconductor portion 20. In the present embodiment, the source contact 7 is not in contact with the buried electrode 8, and is electrically connected to the buried electrode 8 via the source electrode 11. The source electrode 11 is an example of the fourth electrode in the claims. Note that, for convenience of description, the source trench ST is formed on the main surface 2s of the semiconductor region 2, but this does not limit the shape of the semiconductor region 2.

The buried electrode 8 is disposed in the FP insulating film 3 such that a top thereof is located on an upper surface of the FP insulating film 3. Note that the top of the buried electrode 8 does not have to be located on the upper surface of the FP insulating film 3. As described later, the buried electrode 8 is disposed in order to alleviate electric field concentration that occurs in the drift region 24 near a lower end of the gate electrode 6. As illustrated in FIG. 1, the buried electrode 8 includes a source contact SC. The source contact SC is a portion extending upward from the buried electrode 8, and is connected to the source electrode 11. The buried electrode 8 is electrically connected to the source electrode 11 via the source contact SC. The buried electrode 8 is electrically connected to the source contact 7 via the source contact SC and the source electrode 11. The buried electrode 8 is an example of the fourth electrode in the claims.

Figure 5:
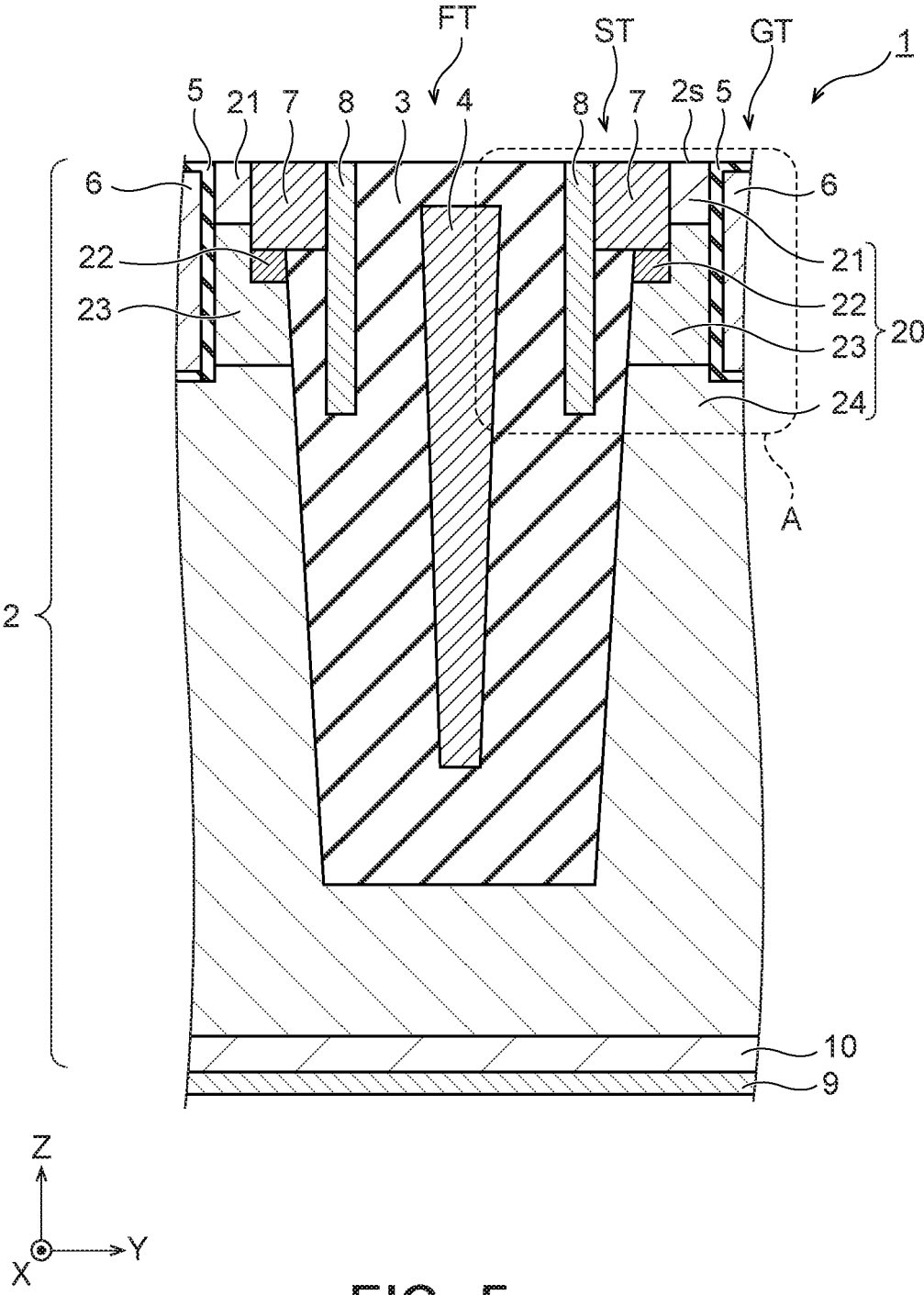
FIG. 5 is a cross-sectional view of a semiconductor device according to a modification of the first embodiment.

Note that the buried electrode 8 may be disposed so as to be in contact with the source contact 7. FIG. 5 illustrates a cross-sectional view of the semiconductor device 1 in this case. As described above, when the source contact 7 and the buried electrode 8 are in contact with each other, for example, the source contact SC does not need to be disposed in the buried electrode 8, and the number of manufacturing steps can be reduced.

In both the configurations of FIGS. 3 and 5, the upper end of the buried electrode 8 is located on the main surface 2s of the semiconductor region 2, and the lower end of the buried electrode 8 is located below the lower end of the source contact 7. That is, as illustrated in FIG. 3, when a distance from an upper surface R of the drain electrode 9 to a bottom of the buried electrode 8 is represented by D1, and a distance from the upper surface R to a bottom of the source contact 7 is represented by D2, the distance D1 is smaller than the distance D2. That is, the bottom of the buried electrode 8 is located closer to the drain electrode 9 than the bottom of the source contact 7. As a result, electric field concentration that occurs in the drift region 24 near the lower end of the gate electrode 6 can be alleviated.

When a distance from the upper surface R to the bottom of the gate electrode 6 is represented by D3, the distance D1 is smaller than the distance D3 in the present embodiment. As a result, the effect of alleviating electric field concentration by the buried electrode 8 can be further increased. The distance D1 and the distance D3 are examples of the first distance and the second distance in the claims, respectively.

Meanwhile, when the distance D1 decreases, that is, when the length of the buried electrode 8 in the Z-axis direction excessively increases, it is found by simulation that the effect of alleviating electric field concentration by the buried electrode 8 is reduced. Specifically, when a difference between the distance D1 and the distance D3 is larger than the length of the gate electrode 6 in the Z-axis direction, the effect of alleviating electric field concentration is reduced. In addition, as the length of the buried electrode 8 in the Z-axis direction increases, a capacitance between a drain and a source increases. Therefore, the difference between the distance D1 and the distance D3 is preferably equal to or less than the length of the gate electrode 6 in the Z-axis direction.

Note that a positional relationship in the Z-axis direction among the buried electrode 8, the source contact 7, and the gate electrode 6 may be defined based on a boundary surface between the source electrode 11 and the FP insulating film 3 (that is, the main surface 2s). That is, a distance from the main surface 2s to an innermost portion (bottom, lower end) of the buried electrode 8 is larger than a distance from the main surface 2s to an innermost portion of the source contact 7. The length from the main surface 2s to the innermost portion of the buried electrode 8 is twice or less the length from the main surface 2s to the innermost portion of the gate electrode 6. As described above, the positional relationship among the buried electrode 8, the source contact 7, and the gate electrode 6 can be defined to be the same as the positional relationship described using the distances D1 to D3 from the upper surface R of the drain electrode 9 based on the main surface 2s.

Note that the buried electrode 8 is not limited to the electrode whose upper end is located on the main surface 2s of the semiconductor region 2. That is, the buried electrode 8 may be disposed so as to be buried in the FP insulating film 3, and the upper end thereof may be located below the main surface 2s.

The buried electrode 8 is made of, for example, a conductive material such as polysilicon, or a metal such as titanium (Ti), tungsten (W), or aluminum (Al).

The buried electrode 8 may be made of the same material as the FP electrode 4. In this case, in the process for manufacturing the semiconductor device 1, the buried electrode 8 and the FP electrode 4 can be formed in the same step. Therefore, manufacturing efficiency can be increased and manufacturing cost can be suppressed.

Here, an example of a manufacturing method in a case where the buried electrode 8 and the FP electrode 4 are formed in the same step will be described. First, an insulating material such as silicon oxide or silicon nitride is deposited in the FP trench FT by, for example, a chemical vapor deposition (CVD) method. The insulating material is deposited inside the FP trench FT so as to leave a space for the FP electrode 4 and the buried electrode 8. Next, polysilicon or the like is deposited in the space by, for example, a CVD method to form the FP electrode 4 and the buried electrode 8. Excess polysilicon is removed by etch back. Thereafter, the insulating material is further deposited on the FP electrode 4 by, for example, a CVD method so as to seal the FP electrode 4 inside the FP trench FT. As a result, the FP insulating film 3 in which the FP electrode 4 is buried is completed.

Note that the buried electrode 8 may be made of the same material as the source electrode 11 and the source contact 7. In this case, in the process for manufacturing the semiconductor device 1, the buried electrode 8 and the source contact 7 can be formed in the same step. Therefore, manufacturing efficiency can be increased and manufacturing cost can be suppressed.

Here, an example of a manufacturing method in a case where the buried electrode 8 and the source contact 7 are formed in the same step will be described. First, a part of the semiconductor region 2 is selectively removed by reactive ion etching (RIE) or the like to form the source trench ST. At the same time as the formation of the source trench ST, or before or after the formation of the source trench ST, a space for disposing the buried electrode 8 is formed in the FP insulating film 3 by RIE or the like. Thereafter, metal is deposited in the source trench ST and the space by, for example, a CVD method to form the source contact 7 and the buried electrode 8, respectively. The metal used here is, for example, titanium, tungsten, or aluminum. Excess metal is removed by etch back.

Next, a layout of the semiconductor device 1 will be described with reference to FIGS. 1 and 2.

The semiconductor device 1 according to the present embodiment includes a plurality of cells constituting one MOSFET. The longitudinal directions of the cells extend in the X-axis direction, and the plurality of cells is arranged in parallel in the Y-axis direction. The FP electrode 4, the source contact 7, and the buried electrode 8 are arranged in parallel in a stripe shape such that the longitudinal direction thereof extends in the X-axis direction. As illustrated in FIG. 1, the gate electrode 6 is disposed between two adjacent cells. That is, in the present embodiment, two adjacent cells share the same gate electrode 6. Note that the present invention is not limited to this, and one cell may have the gate electrode 6 unique to the cell.

As illustrated in FIG. 1, the buried electrodes 8 are disposed in the FP insulating film 3 so as to sandwich the FP electrode 4 therebetween. Terminations of the two buried electrodes 8 sandwiching the FP electrode 4 are open. Meanwhile, in the configuration example of FIG. 2, the two buried electrodes 8 disposed in the same FP insulating film 3 are connected to each other at terminations thereof and integrated with each other. That is, the buried electrode 8 is disposed so as to surround the FP electrode 4 on a plane perpendicular to the Z-axis direction (XY plane).

The source contact 7 is disposed on a side of the buried electrode 8 opposite to the FP electrode 4. The gate electrode 6 is disposed on a side of the source contact 7 opposite to the buried electrode 8. The gate electrode 6 is separated from the source contact 7 by the semiconductor portion 20 and the gate insulating film 5.

As illustrated in FIGS. 1 and 2, the source contact 7 extends to line P-P in the X-axis direction. The gate electrode 6 extends to line Q-Q (to a position where the gate contact GC is present) in the X-axis direction. Therefore, in the semiconductor device 1, a portion substantially operating as the MOSFET is a portion on the left side of line P-P (a portion including both the gate electrode 6 and the source contact 7). That is, the gate electrode 6 located between line P-P and line Q-Q is not directly related to the operation of the semiconductor device 1.

Meanwhile, as illustrated in FIGS. 1 and 2, the buried electrode 8 extends at least to line Q-Q in the X-axis direction. That is, an outermost end E1 of the buried electrode 8 in the longitudinal direction is located at the same position as an outermost end E2 of the gate electrode 6 in the longitudinal direction or outside the outermost end E2 of the gate electrode 6 in the longitudinal direction. In other words, the outermost end E1 of the buried electrode 8 in the longitudinal direction and the outermost end E2 of the gate electrode 6 in the longitudinal direction are aligned in the Y-axis direction, or the outermost end E1 of the buried electrode 8 extends outward with respect to the outermost end E2 of the gate electrode 6 in the longitudinal direction. This is because electric field concentration can occur in a place where the gate electrode 6 is present even if the gate electrode 6 located between line P-P and line Q-Q is not directly related to the operation of the MOSFET. In order to effectively alleviate electrolytic concentration in the vicinity of the termination of the gate electrode 6, the buried electrode 8 is preferably disposed so as to be located outside the outermost end E2 of the gate electrode 6 in the longitudinal direction as illustrated in FIGS. 1 and 2.

The drain electrode 9 is an electrode that functions as a drain electrode of the MOSFET. The drain electrode 9 is disposed under the semiconductor region 2. The drain electrode 9 is electrically connected to the drain region 10. The drain electrode 9 is an example of the first electrode in the claims.

The drain electrode 9 is made of a metal such as titanium (Ti), tungsten (W), or aluminum (Al).

The drain region 10 is a semiconductor region that functions as a drain of the MOSFET. The drain region 10 is disposed on the drain electrode 9. The drain region 10 is located between the drain electrode 9 and the drift region 24. The drain region 10 is, for example, an $n^+$-type semiconductor region.

<Simulation Result>

Figure 6:
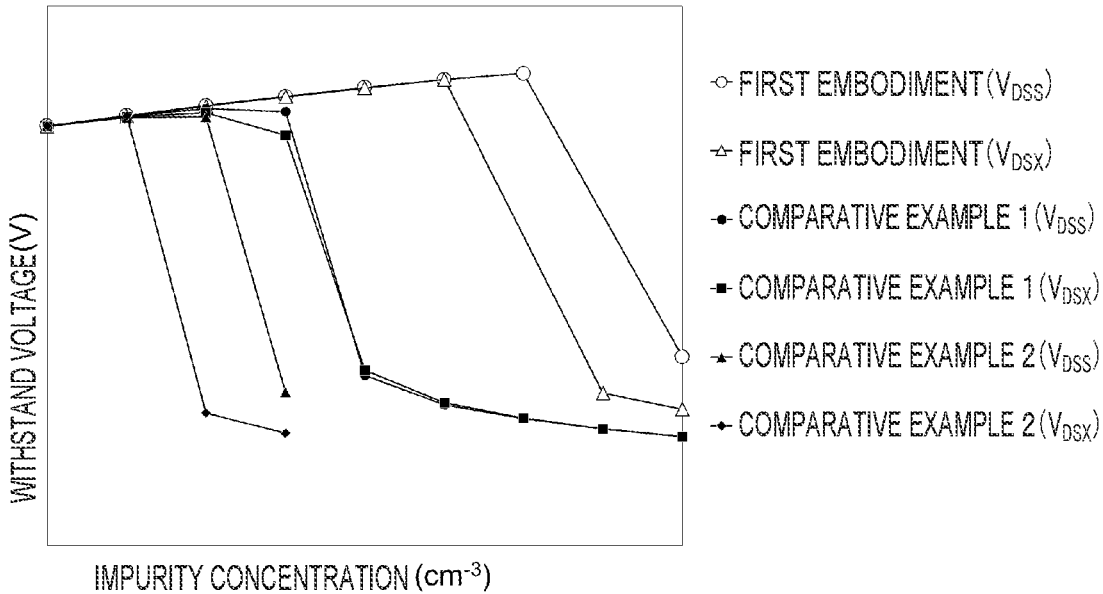
FIG. 6 is a diagram illustrating an example of a relationship between an impurity concentration in a drift region of the semiconductor device according to the first embodiment and a withstand voltage of the semiconductor device.

With reference to FIG. 6, effects obtained by disposing the buried electrode 8 will be described.

FIG. 6 is a graph illustrating an example of a relationship between an impurity concentration in the drift region 24 of the semiconductor device 1 and a withstand voltage (maximum value of a voltage between a drain and a source) of the semiconductor device 1. FIG. 6 also illustrates a relationship between an impurity concentration in a drift region and a withstand voltage in the semiconductor devices according to Comparative Examples 1 and 2. Comparative Example 1 is a MOSFET having a trench FP structure, and Comparative Example 2 is a MOSFET having a gate-separated trench-FP structure without the buried electrode 8.

In FIG. 6, $V_{DSS}$ indicates the magnitude of a withstand voltage measured in a state where a short circuit is performed between a gate and a source. $V_{DSX}$ indicates the magnitude of a withstand voltage measured in a state where a reverse bias voltage is applied between a gate and a source.

As can be seen from FIG. 6, in the gate-separated trench-FP structure of Comparative Example 2, since electric field concentration occurs at a lower end of a gate electrode, a withstand voltage is largely reduced at an impurity concentration lower than that of the trench FP structure of Comparative Example 1.

Meanwhile, in the semiconductor device 1, even if the impurity concentration in the drift region is increased to the impurity concentration at which the withstand voltage decreases in Comparative Examples 1 and 2, the withstand voltage does not decrease. This is because electric field concentration that occurs at the lower end of the gate electrode 6 is alleviated by the buried electrode 8. Therefore, according to the present embodiment, the impurity concentration can be increased while a high withstand voltage is maintained in the gate-separated trench-FP structure.

As described above, according to the present embodiment, since the impurity concentration in the drift region can be increased, the semiconductor device 1 can improve an on-resistance as compared with Comparative Examples 1 and 2. According to simulation, it has been confirmed that an on-resistance per unit area (RonA) is about 190 mΩ·mm² in Comparative Example 1 and about 210 mΩ·mm² in Comparative Example 2, whereas RonA is improved to about 170 mΩ·mm² in the semiconductor device 1.

In addition, the semiconductor device 1 has the gate-separated trench-FP structure, and therefore has a gate input charge amount (Qg) equivalent to that of Comparative Example 2. That is, according to the present embodiment, the on-resistance can be improved while an effect of being able to reduce a gate capacitance is maintained. It has been confirmed that an index represented by a product of an on-resistance and a gate input charge amount (Ron·Qg) is about 580 mΩ·nC in Comparative Example 1 and about 500 mΩ·nC in Comparative Example 2, whereas Ron·Qg is largely improved to about 410 mΩ·nC in the semiconductor device 1.

In addition, an index (Ron·Qoss) represented by a product of an on-resistance and an output charge amount (Qoss) is also improved with improvement of the on-resistance. That is, it has been confirmed that Ron·Qoss is 1720 mΩ·nC or more in Comparative Example 1 and about 1800 mΩ·nC in Comparative Example 2, whereas Ron·Qoss is improved to less than 1650 mΩ·nC in the semiconductor device 1. Here, the output charge amount is a charge amount between a drain and a source.

In addition, according to the present embodiment, it has been confirmed that a charge amount between a gate and a drain (Qgd) and a gate switch charge amount (Qsw) are also improved as compared with those in Comparative Example 1 and Example 2.

As described above, in the first embodiment, by adding the buried electrode 8 in the gate-separated trench-FP structure, electric field concentration that occurs in the drift region near the lower end of the gate electrode 6 can be alleviated. As a result, the impurity concentration in the drift region 24 can be increased while a high withstand voltage is maintained, and therefore reduction in on-resistance can be achieved. Therefore, according to the present embodiment, a semiconductor device having a low gate capacitance and a low on-resistance can be provided.

Second Embodiment

Figure 7:
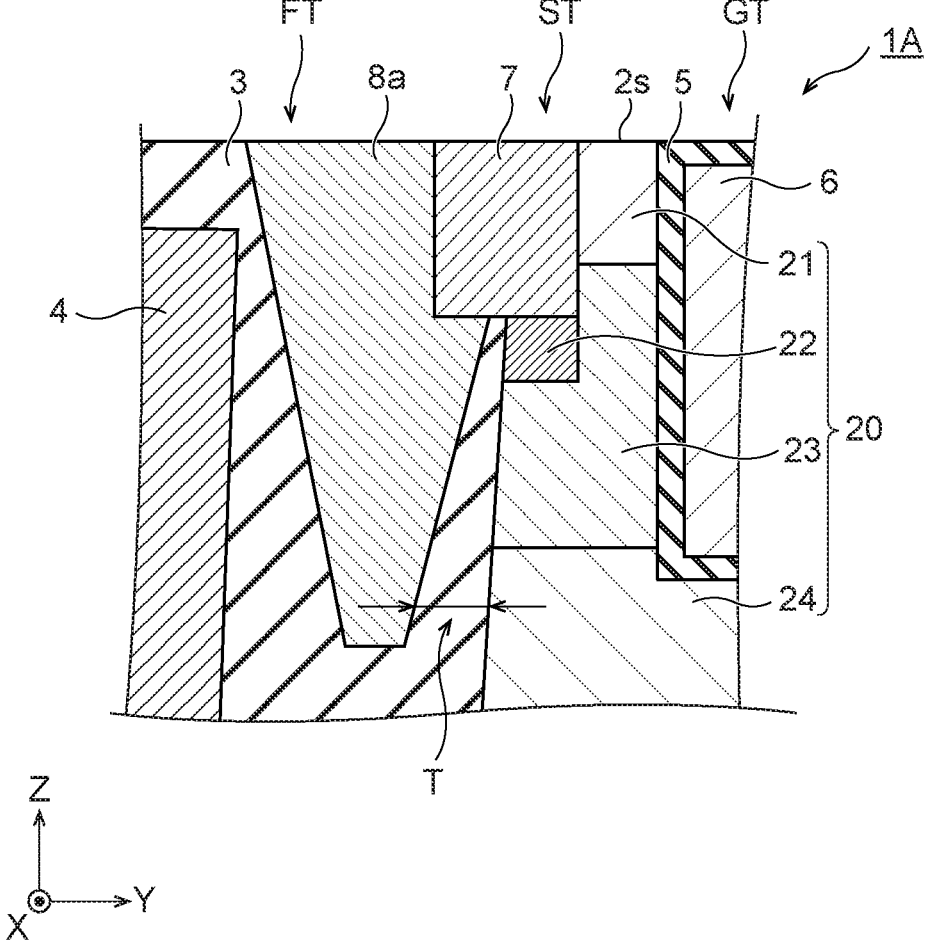
FIG. 7 is a cross-sectional view of a semiconductor device according to a second embodiment.

Next, a second embodiment will be described with reference to FIG. 7. FIG. 7 is a partial cross-sectional view of a semiconductor device 1A according to the second embodiment. In FIG. 7, elements having the same names or functions as those in FIG. 4 described in the first embodiment are denoted by the same reference numerals. Hereinafter, description will be omitted except for matters changed or added.

In the first embodiment, it has been described that electric field concentration that occurs in the drift region near the lower end of the gate electrode 6 can be alleviated by the buried electrode 8. However, at the same time, it is found from a simulation result that the effect of alleviating electric field concentration decreases toward an upper portion of the buried electrode 8.

Therefore, in the second embodiment, as illustrated in FIG. 7, the width of a buried electrode 8a is increased toward a main surface 2s. Therefore, the thickness T of an FP insulating film 3 between the buried electrode 8a and a semiconductor portion 20 decreases from a drain electrode 9 side toward a source contact 7. As a result, a decrease in the effect of alleviating electric field concentration in an upper portion of the buried electrode 8 can be suppressed. That is, by decreasing the thickness T of the FP insulating film 3 to enhance the effect of alleviating electric field concentration by the buried electrode 8a, it is possible to compensate for a decrease in the effect of alleviating electric field concentration in the upper portion of the buried electrode 8.

With the semiconductor device 1A according to the second embodiment, a simulation result has been obtained in which indicators of the on-resistance (RonA), the index Ron·Qoss, the index Ron·Qg, Qgd, and Qsw are improved as compared with those of the semiconductor device 1 according to the first embodiment.

As described above, in the semiconductor device 1A according to the second embodiment, by decreasing the thickness T of the FP insulating film 3 between the buried electrode 8a and the semiconductor portion 20 toward the main surface 2s, the effect of alleviating electric field concentration can be obtained for the entire gate electrode 6. As a result, an impurity concentration in a drift region 24 can be further increased while a high withstand voltage is maintained, and further reduction in on-resistance can be achieved.

Third Embodiment

Figure 8:
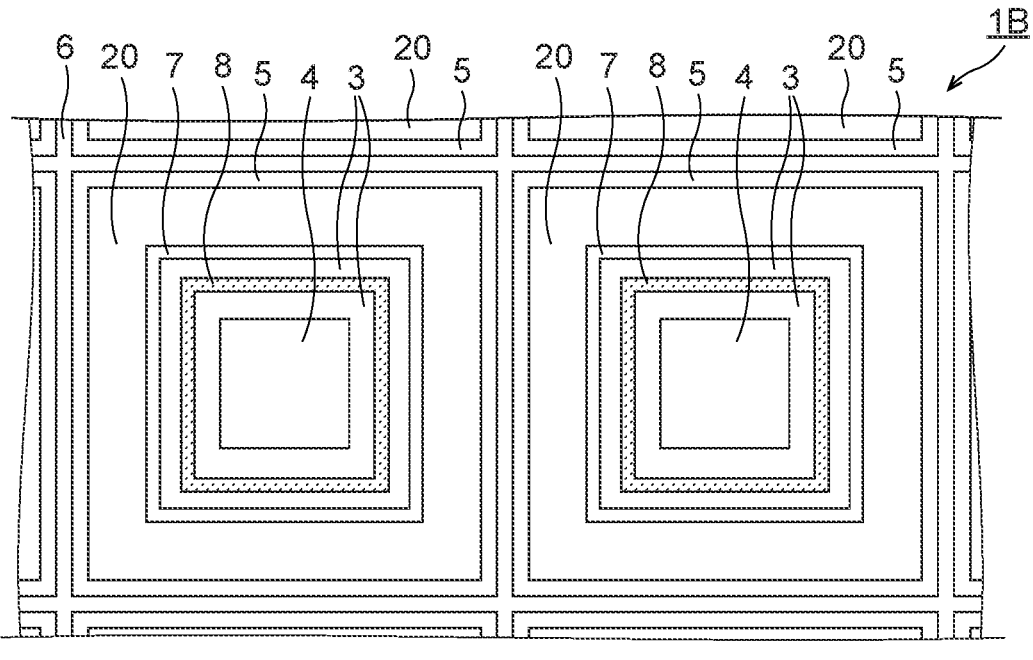
FIG. 8 is a plan view of a semiconductor device according to a third embodiment.

Next, a third embodiment will be described with reference to FIG. 8. FIG. 8 is a plan view illustrating a part of a semiconductor device 1B according to the third embodiment. Elements having the same names or functions as those in FIG. 1 described in the first embodiment are denoted by the same reference numerals. Hereinafter, description will be omitted except for matters changed or added.

In the first and second embodiments, as illustrated in FIG. 1, a plurality of cells is arranged in parallel in a stripe shape in the Y-axis direction. Meanwhile, in the third embodiment, as illustrated in FIG. 8, a plurality of cells (dot-shaped cells) having a substantially square shape is arranged. By adopting such a layout, the degree of integration of the semiconductor device 1B can be improved.

In the present embodiment, as illustrated in FIG. 8, a gate electrode 6 is formed in a lattice shape. The cell is disposed in a void of the lattice formed by the gate electrode 6. When such a layout is adopted, the area of the gate electrode 6 in contact with a semiconductor portion 20 increases near a vertex (corner) of the lattice. Therefore, electric field concentration is more likely to occur in the semiconductor portion 20 near the vertex of the substantially square shape of each of the cells. However, as described later, by applying a buried electrode 8 that alleviates electric field concentration to the dot-shaped cell, electric field concentration that occurs in the semiconductor portion 20 near the vertex of the substantially square shape of the cell can be alleviated.

As illustrated in FIG. 8, when the semiconductor region 2 is viewed in the thickness direction, an FP electrode 4, the buried electrode 8, and a source contact 7 form a cell in which the FP electrode 4, the buried electrode 8, and the source contact 7 are disposed in a concentric substantially square shape around the FP electrode 4.

The FP electrode 4 is disposed substantially at the center of the FP insulating film 3 (substantially at the center of the lattice of the gate electrode 6). The buried electrode 8 is disposed in the FP insulating film 3 so as to surround the FP electrode 4. The source contact 7 is disposed so as to surround the buried electrode 8. Note that the source contact 7 and the buried electrode 8 may be in contact with each other.

Note that the shape in which the FP electrode 4, the buried electrode 8, and the source contact 7 are disposed is not limited to the concentric substantially square shape, and may be, for example, a concentric substantially polygonal shape or a concentric substantially circular shape.

In addition to the lattice shape, the gate electrode 6 may adopt any shape that improves the degree of integration of the semiconductor device 1B. For example, the gate electrode 6 may have a hexagonal shape (honeycomb shape) or a shape (zigzag shape) in which intersections of the gate electrodes 6 do not overlap with each other in the X-axis direction or the Y-axis direction on a plane perpendicular to the Z-axis direction.

Adjacent cells do not have to share the same gate electrode 6. That is, each of the cells may have the gate electrode 6 unique to the cell.

As described above, according to the third embodiment, by applying the buried electrode 8 to the dot-shaped cell, electric field concentration that occurs in the semiconductor portion 20 near the vertex of the substantially square shape of the cell can be alleviated. Therefore, high integration of the semiconductor device can be achieved, and reduction in on-resistance can be achieved while a low gate capacitance is maintained.

Fourth Embodiment

Figure 9:
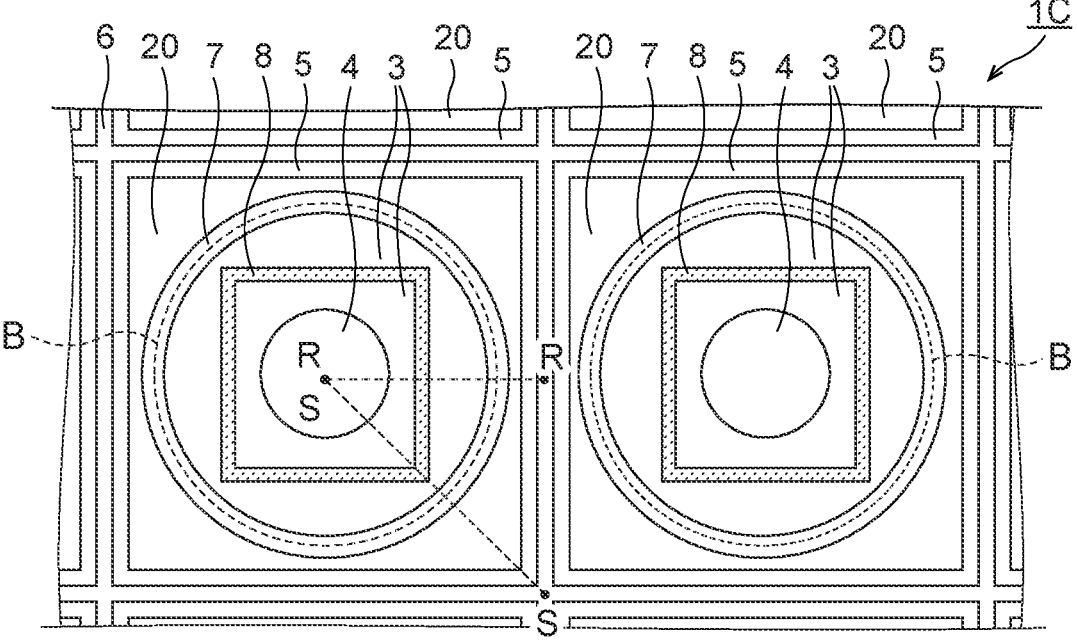
FIG. 9 is a plan view of a semiconductor device according to a fourth embodiment.

Next, a fourth embodiment will be described with reference to FIG. 9. FIG. 9 is a plan view illustrating a part of a semiconductor device 1C according to the fourth embodiment. Elements having the same names or functions as those in FIG. 1 described in the first embodiment are denoted by the same reference numerals. Hereinafter, description will be omitted except for matters changed or added.

In the case of the cell having a substantially square shape described in the third embodiment, the effect of alleviating electric field concentration by the buried electrode 8 is reduced at a corner where a distance between the buried electrode 8 and the gate electrode 6 increases. In addition, since the thickness of the FP insulating film 3 between the buried electrode 8 and the semiconductor portion 20 also increases at the corner, the effect of alleviating electric field concentration is further reduced. In the present embodiment, as described below, by forming a boundary B between an FP insulating film 3 and a semiconductor portion 20 in a substantially circular shape, reduction in the effect of alleviating electric field concentration is suppressed.

As illustrated in FIG. 9, in the present embodiment, when a semiconductor region 2 is viewed in the thickness direction, the boundary B between the FP insulating film 3 and the semiconductor portion 20 has a substantially circular shape, and a source contact 7 is disposed in a substantially circular shape along the boundary B. When the semiconductor region 2 is viewed in the thickness direction, the buried electrode 8 is disposed in a substantially square shape so as to surround an FP electrode 4. One side of the substantially square shape formed by the buried electrode 8 is substantially parallel to any one side of the substantially square shape of the lattice formed by the gate electrode 6.

Note that the shape of the FP electrode 4 is not limited to the substantially circular shape illustrated in FIG. 9, and may be any shape.

Figure 10:
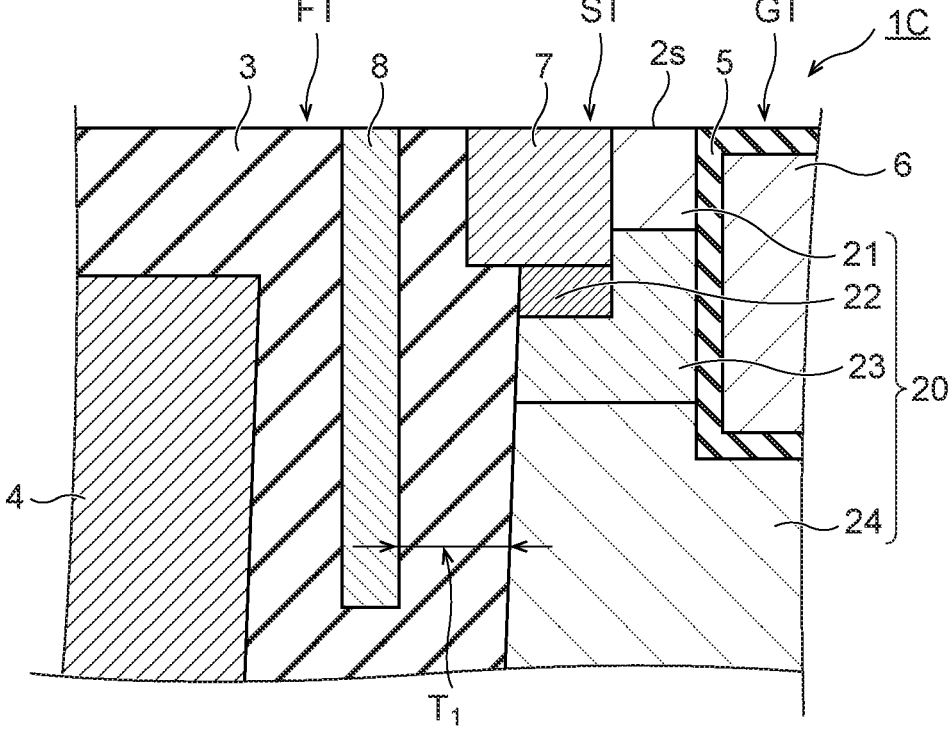
FIG. 10 is a cross-sectional view of the semiconductor device according to the fourth embodiment, taken along line R-R in FIG. 9.
Figure 10:
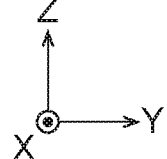
Figure 11:
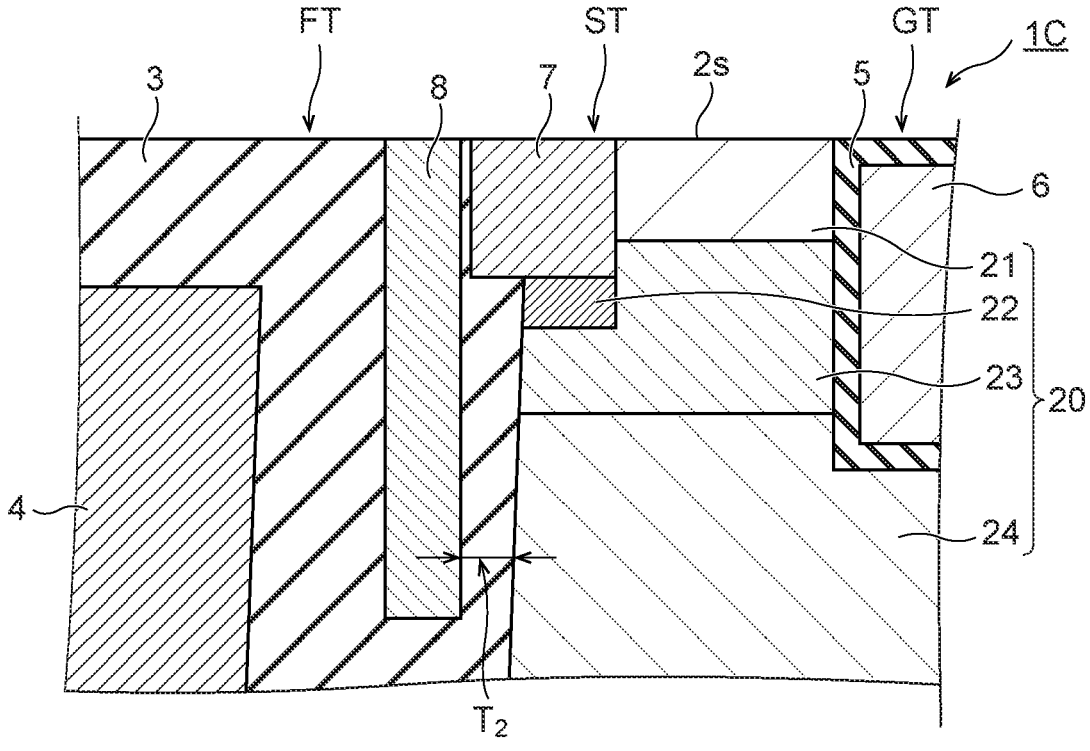
FIG. 11 is a cross-sectional view of the semiconductor device according to the fourth embodiment, taken along line S-S in FIG. 9.
Figure 11:
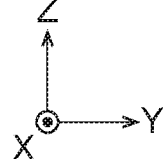

FIG. 10 is a cross-sectional view of the semiconductor device 1C according to the fourth embodiment, taken along line R-R in FIG. 9. FIG. 11 is a cross-sectional view of the semiconductor device 1C according to the fourth embodiment, taken along line S-S in FIG. 9. Here, line R-R is a line that passes through the center of the substantially square shape formed by the lattice-shaped gate electrode 6 and is parallel to one side of the lattice. Line S-S is a diagonal line of the substantially square shape formed by the lattice-shaped gate electrode 6.

As illustrated in FIGS. 10 and 11, the thickness $T_2$ of the FP insulating film 3 between the buried electrode 8 and the semiconductor portion 20 in FIG. 11 is smaller than the thickness $T_1$ of the FP insulating film 3 between the buried electrode 8 and the semiconductor portion 20 in FIG. 10. In addition, the thickness $T_2$ is smaller than the thickness of the FP insulating film 3 between the buried electrode 8 and the semiconductor portion 20 at the corner of the cell of the third embodiment. As described above, in the present embodiment, the thickness of the FP insulating film 3 is reduced at a position where a distance between the buried electrode 8 and the gate electrode 6 is relatively large. Therefore, a decrease in the effect of alleviating electric field concentration at the corner of the substantially square shape can be suppressed.

Note that the shape of the boundary B is not limited to the substantially circular shape as long as the thickness of the FP insulating film 3 can be reduced at a position where the distance between the buried electrode 8 and the gate electrode 6 is relatively large. For example, when the buried electrode 8 is a square, the boundary B may have a square shape concentric with the square and rotated by 45°.

As described above, according to the fourth embodiment, electric field concentration that occurs in the semiconductor portion 20 near the vertex of the substantially square shape of the cell can be alleviated as compared with the third embodiment.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

The invention claimed is:

1. A semiconductor device comprising:
   a first electrode;
   a first semiconductor region of a first conductivity type disposed above the first electrode and electrically connected to the first electrode;
   a second semiconductor region of a second conductivity type disposed on the first semiconductor region;
   a third semiconductor region of the first conductivity type disposed on the second semiconductor region;
   a second electrode disposed in the first semiconductor region via a first insulating film;
   a third electrode facing the second semiconductor region via a second insulating film in a second direction perpendicular to a first direction directed from the second semiconductor region toward the third semiconductor region;
   a fourth electrode having a portion adjacent to a part of the second semiconductor region and the third semiconductor region in the second direction, and electrically connected to the second electrode, the second semiconductor region, and the third semiconductor region; and
   a fifth electrode disposed in the first insulating film, having a bottom located closer to the first electrode than a bottom of the portion of the fourth electrode, having a top located on an upper surface of the first insulating film, and electrically connected to the fourth electrode, wherein a first distance from an upper surface of the first electrode to a bottom of the fifth electrode is smaller than a second distance from the upper surface of the first electrode to a bottom of the third electrode, and a difference between the first distance and the second distance is equal to or less than a length of the third electrode in the first direction.

2. The semiconductor device according to claim 1, wherein the fifth electrode is not in contact with the portion of the fourth electrode.

3. The semiconductor device according to claim 2, wherein the fifth electrode is made of the same material as the portion of the fourth electrode.

4. The semiconductor device according to claim 1, wherein the fifth electrode is in contact with the portion of the fourth electrode.

5. The semiconductor device according to claim 4, wherein the fifth electrode is made of the same material as the portion of the fourth electrode.

6. The semiconductor device according to claim 4, wherein a first distance from an upper surface of the first electrode to a bottom of the fifth electrode is smaller than a second distance from the upper surface of the first electrode to a bottom of the third electrode.

7. The semiconductor device according to claim 1, wherein a thickness of the first insulating film between the fifth electrode and a semiconductor portion including the first semiconductor region and the second semiconductor region decreases in a direction from the first electrode toward the portion of the fourth electrode.

8. The semiconductor device according to claim 7, wherein the fifth electrode is in contact with the portion of the fourth electrode.

9. The semiconductor device according to claim 7, wherein a first distance from an upper surface of the first electrode to a bottom of the fifth electrode is smaller than a second distance from the upper surface of the first electrode to a bottom of the third electrode.

10. The semiconductor device according to claim 1, wherein the fifth electrode is made of the same material as the portion of the fourth electrode.

11. The semiconductor device according to claim 1, wherein the fifth electrode is made of the same material as the second electrode.

12. The semiconductor device according to claim 1, wherein the second electrode and the fifth electrode are arranged in parallel in a stripe shape on a plane perpendicular to the first direction, a pair of fifth electrodes, including the fifth electrode, is provided in the semiconductor device, the pair of fifth electrodes being disposed so as to sandwich the second electrode therebetween, and an outermost end of the fifth electrodes in a longitudinal direction and an outermost end of the third electrode in the longitudinal direction are aligned in the second direction, or the outermost end of the fifth electrode extends outward with respect to the outermost end of the third electrode in the longitudinal direction.

13. The semiconductor device according to claim 1, wherein the fifth electrode is disposed so as to surround the second electrode on a plane perpendicular to the first direction, and an outermost end of the fifth electrode in a longitudinal direction and an outermost end of the third electrode in the longitudinal direction are aligned in the second direction, or the outermost end of the fifth electrode extends outward with respect to the outermost end of the third electrode in the longitudinal direction.

14. The semiconductor device according to claim 1, wherein the second electrode, the fifth electrode, and the portion of the fourth electrode are disposed in a concentric polygonal shape or a concentric circular shape around the second electrode on a plane perpendicular to the first direction, the second electrode is disposed at a center in the first insulating film, the fifth electrode is disposed in the first insulating film so as to surround the second electrode, and the portion of the fourth electrode is disposed so as to surround the fifth electrode.

15. The semiconductor device according to claim 14, wherein the third electrode is formed in a lattice shape, a hexagonal shape, or a shape in which intersections of the third electrode do not overlap with each other in the second direction or in a third direction orthogonal to the first direction and the second direction on a plane perpendicular to the first direction, and the second electrode, the fifth electrode, and the portion of the fourth electrode are disposed in a void formed by the third electrode.

16. The semiconductor device according to claim 14, wherein on a plane perpendicular to the first direction, the third electrode is formed in a lattice shape, a boundary between the first insulating film and a semiconductor portion including the first semiconductor region and the second semiconductor region is disposed in a circular shape, the fifth electrode is disposed in a square shape, and the portion of the fourth electrode is disposed in a circular shape along the boundary.

17. A semiconductor device comprising:

a first electrode;

a first semiconductor region of a first conductivity type disposed above the first electrode and electrically connected to the first electrode;

a second semiconductor region of a second conductivity type disposed on the first semiconductor region;

a third semiconductor region of the first conductivity type disposed on the second semiconductor region;

a second electrode disposed in the first semiconductor region via a first insulating film;

a third electrode facing the second semiconductor region via a second insulating film in a second direction perpendicular to a first direction directed from the second semiconductor region toward the third semiconductor region;

a fourth electrode having a portion adjacent to a part of the second semiconductor region and the third semiconductor region in the second direction, and electrically connected to the second electrode, the second semiconductor region, and the third semiconductor region; and a fifth electrode disposed in the first insulating film, having a bottom located closer to the first electrode than a bottom of the portion of the fourth electrode, having a top located on an upper surface of the first insulating film, and electrically connected to the fourth electrode, wherein the fifth electrode is in contact with the portion of the fourth electrode, a first distance from an upper surface of the first electrode to a bottom of the fifth electrode is smaller than a second distance from the upper surface of the first electrode to a bottom of the third electrode, and a difference between the first distance and the second distance is equal to or less than a length of the third electrode in the first direction.

18. A semiconductor device comprising:

a first electrode;

a first semiconductor region of a first conductivity type disposed above the first electrode and electrically connected to the first electrode;

a second semiconductor region of a second conductivity type disposed on the first semiconductor region;

a third semiconductor region of the first conductivity type disposed on the second semiconductor region;

a second electrode disposed in the first semiconductor region via a first insulating film;

a third electrode facing the second semiconductor region via a second insulating film in a second direction perpendicular to a first direction directed from the second semiconductor region toward the third semiconductor region;

16 a fourth electrode having a portion adjacent to a part of the second semiconductor region and the third semiconductor region in the second direction, and electrically connected to the second electrode, the second semiconductor region, and the third semiconductor region; and a fifth electrode disposed in the first insulating film, having a bottom located closer to the first electrode than a bottom of the portion of the fourth electrode, having a top located on an upper surface of the first insulating film, and electrically connected to the fourth electrode, wherein a thickness of the first insulating film between the fifth electrode and a semiconductor portion including the first semiconductor region and the second semiconductor region decreases from the first electrode side toward the portion of the fourth electrode, a first distance from an upper surface of the first electrode to a bottom of the fifth electrode is smaller than a second distance from the upper surface of the first electrode to a bottom of the third electrode, and a difference between the first distance and the second distance is equal to or less than a length of the third electrode in the first direction.

* * * * *